United States Patent [19]

Sharpe-Geisler

[11] Patent Number: 5,457,404
[45] Date of Patent: Oct. 10, 1995

[54] ZERO-POWER OR GATE

[75] Inventor: Bradley A. Sharpe-Geisler, San Jose, Calif.

[73] Assignee: Advanced Micro Devices, Inc., Sunnyvale, Calif.

[21] Appl. No.: 118,801

[22] Filed: Sep. 8, 1993

[51] Int. Cl.⁶ .................................................. H03R 17/09
[52] U.S. Cl. ................. 326/17; 326/37; 326/98; 327/544
[58] Field of Search ................. 307/443, 451, 307/465, 480, 481; 326/17, 37, 93, 98, 121; 327/51, 544

[56] References Cited

U.S. PATENT DOCUMENTS

| | | | |
|---|---|---|---|
| 4,503,341 | 3/1985 | Shah | 307/443 X |
| 4,563,598 | 1/1986 | Oritani | 307/443 X |
| 4,620,116 | 10/1986 | Ozawa | 307/443 X |
| 4,831,285 | 5/1989 | Gaiser | 307/465 |
| 4,959,564 | 9/1990 | Steele | 307/465 |

Primary Examiner—David R. Hudspeth
Attorney, Agent, or Firm—Fliesler, Dubb, Meyer & Lovejoy

[57] ABSTRACT

A zero-power wide OR gate for implementing the "sum" of the "sum of product terms" in a programmable logic device (PLD). The wide OR gate includes a single additional input transistor for each added "product term" input from a sense amplifier. The wide OR gate further includes circuitry to decouple the current supply from sense amplifiers turned on during sleep mode to limit power utilized. To increase operation speed, the wide OR gate utilizes a strong current source when sense amplifiers are all turned off to quickly pull up internal circuitry while utilizing a weak current source when sense amplifiers turn on to allow the sense amplifiers to more easily overcome the current supply. To further increase speed, the wide OR gate includes a threshold shifting transistor to shift the pull down threshold of the output inverter for when all sense amplifiers are turned off while shifting the threshold back for when a sense amplifier transitions to on.

13 Claims, 4 Drawing Sheets

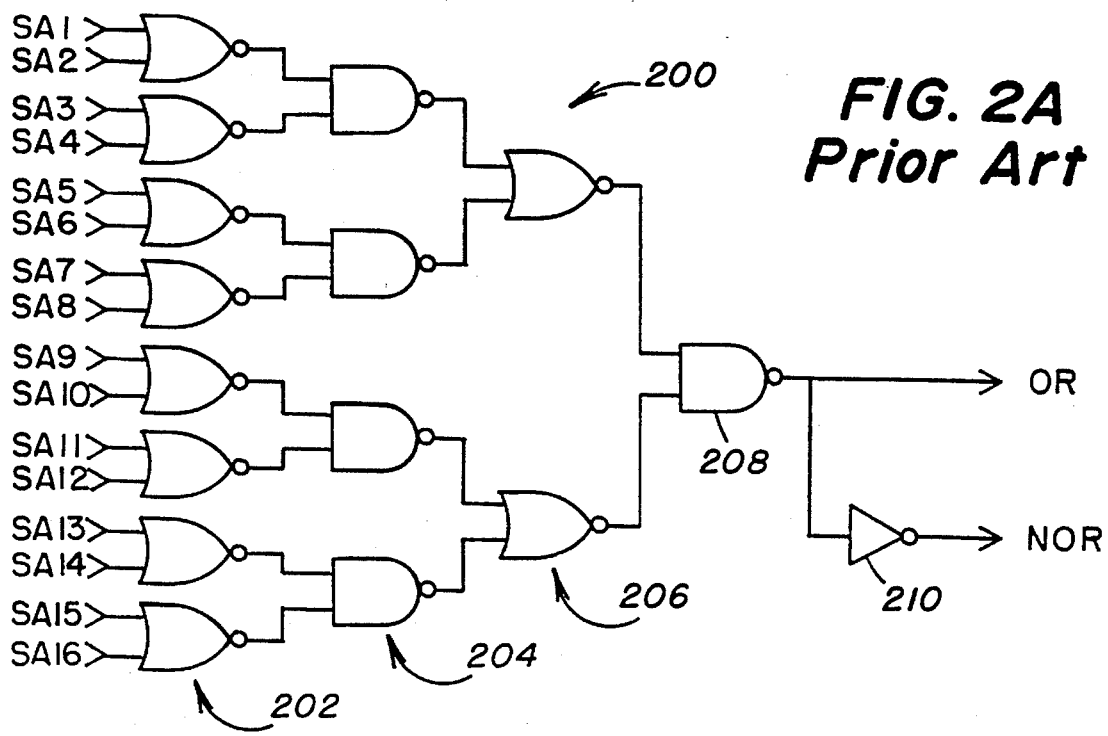
FIG. 2A
Prior Art
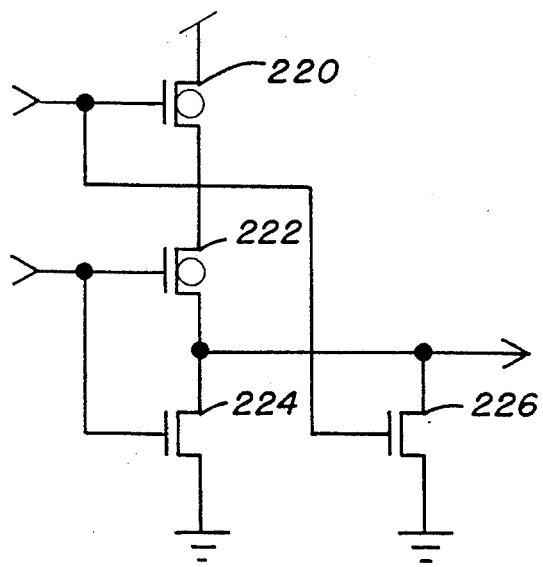
FIG. 2B
Prior Art
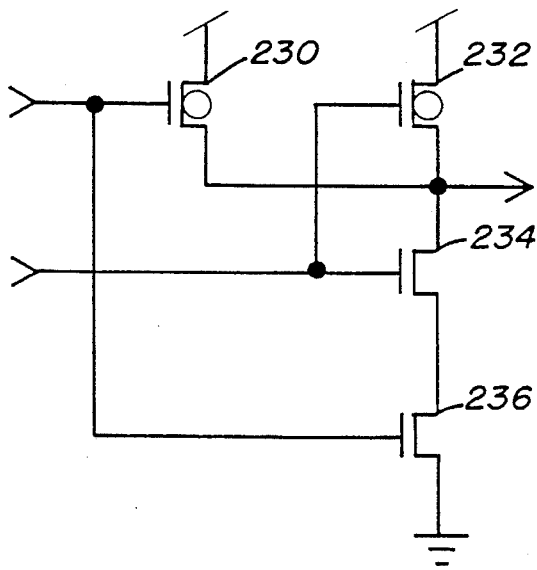
FIG. 2C
Prior Art
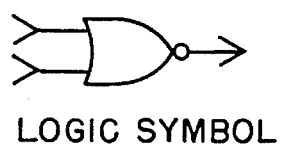
LOGIC SYMBOL
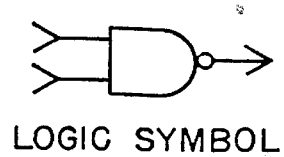
LOGIC SYMBOL

LOGIC SYMBOL

LOGIC SYMBOL

ZERO-POWER OR GATE

BACKGROUND OF THE INVENTION

1. Field of the Invention

The present invention relates to wide or multiple input OR gates used to implement the "sum" of the "sum of product terms" in a programmable logic device (PLD). More particularly, the present invention relates to circuitry for a zero-power wide OR gate responsive to a sleep mode signal to reduce power consumption and having circuitry allowing a reduced recovery time from a sleep mode.

2. Description of the Prior Art
Prior Art PLD
Utilizing a Wide OR gate

FIG. 1 shows an array structure for a typical prior art programmable array logic (PAL) device, a type of PLD which utilizes a multiple input OR gate to implement the "sum" to produce a "sum of product terms" output.

The PAL of FIG. 1 has six inputs $I_{0-5}$ and four outputs $O_{0-3}$. The inputs $I_{0-5}$ each have a true output 104 and a complement output 106 forming rows connected to programmable array cells, such as programmable array cell 110, of programmable array cells 108. An array cell, such as cell 110, may be programmed to be connected or disconnected to an AND gate in the AND array 100. Groups of array cells programmed to be connected to an AND gate in AND array 100 form a "product term" of the "sum of product terms" output. The AND array 100 is followed by an OR array 102. Each OR gate in the OR array 102 is connected to one or more AND gates in AND array 100 to provide the "sum" of the "sum of product terms" output.

Although the OR gates in OR array 102 are shown with fixed connections to a number of AND gates in AND array 100, some PAL circuit configurations allow each OR gate in OR array 102 to be programmably connected to any AND gate output in AND array 100. The OR gates in OR array 102 may also have outputs connected to an output logic macrocell 114 which is programmable to be either registered or combinatorial. Circuitry similar to that shown in FIG. 1, including the output logic macrocell 114, is utilized on the AmPALCE22V10, a device manufactured by Advanced Micro Devices, Inc.

To assure sufficient voltage is provided to OR gates in OR gate array 102 at a high speed, sense amplifiers are utilized by manufacturers to implement the AND gates in the AND array 110. Sense amplifiers convert a small voltage from the product term into a larger, rail to rail, voltage at a high speed to drive an OR gate. Circuitry for sense amplifiers utilized to implement an AND gate to create a "product term" portion of the "sum of product terms" output for a PAL device is shown in copending U.S. application Ser. No. 08/118432 entitled "Latching Zero-Power Sense Amplifier With Cascode" which is incorporated herein by reference.
Prior Art
Wide OR Gates FIG. 2A shows circuitry for a prior art CMOS wide OR gate 200. The wide OR gate 200 includes several input NOR gates 202, with each NOR gate in NOR gates 202 receiving two signals from input signals SA1–SA16. The input signals SA1–SA16 are provided by sense amplifiers used to implement AND gates as discussed above with respect to FIG. 1. Outputs of NOR gates 202 are provided in pairs to inputs of NAND gates 204. The outputs of NAND gates 204 are provided as inputs to NOR gates 206. The outputs of NOR gates 206 are provided as inputs to NAND gate 208. The cascading of NOR gates 202, NAND gates 204, NOR gates 206, and NAND gate 208 forms a binary tree so that NAND gate 208 can provide the OR output of wide OR gate 200. An inverter 210 is further connected to the output of NAND gate 208 to also provide a NOR output for wide OR gate 200.

Circuitry for individual NOR gates of NOR gates 202 and 206 is shown in FIG. 2B. The NOR gate of FIG. 2B includes two p-channel transistors 220 and 222 and two n-channel transistors 224 and 226. The circles on transistors, such as transistors 220 and 222, indicate a p-channel transistor,- while no circle indicates an n-channel transistor. P-channel transistor 220 has a source connected to $V_{DD}$ and a drain connected to the source of p-channel transistor 222. The drain of p-channel transistor 222 is connected to the drain of n-channel transistors 224 and 226 and provides the NOR gate output. The sources of transistors 224 and 226 are connected to $V_{SS}$. The two inputs of the NOR gate are coupled to one p-channel transistor of transistors 220 and 222 and one n-channel transistor of transistors 224 and 226 respectively.

Circuitry for individual NAND gates of NAND gates 204 and 208 is shown in FIG. 2C. The NAND gate of FIG. 2C includes two p-channel transistors 230 and 232 and two n-channel transistors 234 and 236. The sources of p-channel transistors 230 and 232 are coupled to $V_{DD}$, while their drains are coupled together and to the drain of n-channel transistor 234 to form the NAND gate output. The source of n-channel transistor 234 is coupled to the drain of n-channel transistor 236, and the source of transistor 236 is coupled to $V_{SS}$. The two inputs of the NAND gate are coupled to one p-channel transistor of transistors 230 and 232 and one n-channel transistor of transistors 234 and 236 respectively.

The circuitry of FIG. 2A is ideal to implement relatively narrow NOR gates. The wide OR gate 200 of FIG. 2A, however, has drawbacks. First, the wide OR gate 200 is not well suited for more than eight inputs because of a comparatively high transistor count. Each two input gate consists of four transistors so that ultimately, because of cascading used in the binary tree, each input adds roughly four transistors. Second, wide OR gate 200 has a speed disadvantage as compared to other circuits.

FIG. 3A shows circuitry for a prior art CMOS OR gate 300 having a lower transistor count than the wide OR gate 200 of FIG. 2A. The wide OR gate 300 includes input NOR gates 302, each NOR gate of NOR gates 302 receiving four of input signals SA1–SA16. The outputs of NOR gates 302 are provided to a single NAND gate 304. The output of NAND gate 304 forms the OR output of wide OR gate 300. An inverter 306 is further connected to the output of NAND gate 304 to also provide a NOR output for wide OR gate 200.

Circuitry for individual NOR gates of NOR gates 302 is shown in FIG. 3B. The NOR gate of FIG. 3B includes four p-channel transistors 311–314 and four n-channel transistors 321–324. P-channel transistors 311–314 have current paths between their source and drain connected in series between $V_{DD}$ and the output of the NOR gate. N-channel transistors 321–324 have drains coupled to the output of the NOR gate, and sources coupled to $V_{SS}$. Each of the four inputs of the NOR gate are coupled to one p-channel transistor of transistors 311–314 and one n-channel transistor of transistors 321–324 respectively.

Circuitry for four input NAND gate 304 is shown in FIG. 3C. The NAND gate of FIG. 3B includes four p-channel transistors 331–334 and four n-channel transistors 341–344. N-channel transistors 341–344 have current paths between their source and drain connected in series between the output of the NAND gate and $V_{SS}$. P-channel transistors 331–334 have drains coupled to $V_{DD}$ and sources coupled to the output of the NAND gate. Each of the four inputs of the NAND gate are coupled to one p-channel transistor of transistors 331–334 and one n-channel transistor of transistors 341–344 respectively.

Although the wide OR gate 300 of FIG. 3A has a comparably lower transistor count than the wide OR gate 200 of FIG. 2A, the wider OR gate 300 of FIG. 3A has an even greater speed disadvantage than the OR gate 200 of FIG. 2A.

Prior Art
Zero-Power Devices

With the introduction of notebook computers and other devices utilizing battery power, electronic circuits in the devices are required to utilize as little power as possible to preserve the batteries for an extended period of time. Even with devices which are not battery powered, it is desirable to have electronic circuits which operate with as little power consumption as possible to conserve energy, thus reducing operational costs.

Manufacturers have developed specialized electronic parts, called zero power parts, for use in battery powered devices such as notebook computers. The zero power parts have a low power consumption mode, also referred to as a sleep mode, which is entered when the zero power part has not been accessed for a period of time. To create the sleep mode, a sleep mode signal is developed by circuitry in the zero-power part and is transmitted in a true state to turn off internal components of the zero power part when an input signal has not been received for a period of time. The sleep mode signal is transmitted in a complement state to power up, or wake up the internal components of the zero-power part from a sleep mode when another input signal to the zero-power part is received.

For the AmPALCE22V10 discussed above, a zero power version, the AmPALCE22V10Z-25, is also available from Advanced Micro Devices, Inc. The AmPALCE22V10Z-25 operates at a lower speed than non zero-power versions because it requires time to be powered up from a sleep mode.

Prior Art Wide OR Gate
Utilized on Zero-Power Device

Because of the design of zero-power sense amplifiers used to implement AND gates on the AmPALCE22V10Z-25, the wide OR gates utilized are specially designed to be compatible. Zero-power sense amplifiers on the AmPALCE22V10Z-25 have outputs placed in a low state during sleep mode to conserve power. When an input transition is detected causing the zero-power components to power up from sleep mode, the zero-power sense amplifiers require a recovery time period to return to a high state if necessary.

Because the zero-power sense amplifiers go to a low state during sleep mode, unlike the OR gates of FIGS. 2A and 3A, OR gates on the AmPALCE22V10Z-25 include circuitry to latch their output to the state of the previous wake mode during sleep mode to prevent the OR gate outputs from being affected. Also, because of the time delay for the sense amplifier to power up, OR gates on the AmPALCE22V10Z-25 include circuitry to delay power up until after the sense amplifiers have had time to recover to avoid outputting an erroneous signal.

The zero-power wide OR gate 400 utilized on the AmPALCE22v10Z-25 is shown in FIG. 4. To receive the sense amplifier inputs, wide OR gate 400 includes n-channel transistors $402_1$–$402_n$ which receive input signals SA1–SAn from sense amplifiers at their gates. The sources of transistors $402_1$–$402_n$ are coupled to $V_{SS}$, while the drains are coupled to a current source transistor 404 at node 401.

To latch the previous state of the OR gate during a sleep mode, the OR gate 400 further includes a latch formed by inverters 406 and 408. A connection between inverters 406 and 408 is labeled 411. The latch 406, 408 is connected at node 411 through the current path formed between the source and drain of a transistor 410 to node 401. A pair of transistors 412 and 414 have current paths connected in parallel between node 411 and inverter 408. Transistors 410 and 414 have gates coupled to a line PHI, while transistor 412 is coupled to a line PHIB. The line PHI carries a sleep mode signal indicating a sleep mode in a low state, while the line PHIB carries a sleep mode signal indicating the sleep mode in a high state.

To provide the OR output of wide OR gate 400, an inverter 416 is connected to node 411 and provides the OR output of wide OR gate 400 as its output. Further, an additional connection to node 411 provides a NOR output for wide OR gate 400.

In operation, we begin by assuming a first state where the sleep mode signal indicates an awake state with PHI being high and PHIB being low, and no sense amplifier output is high. With no sense amplifier high, none of transistors $402_1$–$402_n$ will conduct and current source transistor 404 pulls node 401 high. With PHI high transistor 410 will further conduct making node 411 high.

With node 411 high, the NOR output will be high and the OR output through inverter 416 will be low. With PHI high and PHIB low, transistors 412 and 414 will be off isolating the output of inverter 408. Because node 411 is high, the output of inverter 406 will be low, while the output of inverter 408 will be high.

If any of sense amplifier outputs SA1–SAn go high, the associated transistor $401_1$–$401_n$ will conduct, overcoming the current from transistor 404 thus pulling node 401 low. Because PHI is still high, transistor 410 will conduct pulling node 411 low and further pulling the NOR output high and the OR output low. With PHIB remaining low, transistors 412 and 414 will remain off isolating the output of inverter 408. Since node 411 is low, the output of inverter 406 will go high while the output of inverter 408 will go low.

We next assume a state where the sleep mode signal indicates a sleep state with PHI being low and PHIB being high, and no sense amplifier output is high. With PHI low and PHIB high, transistors 412 and 414 are on and transistor 410 is off connecting the output of inverter 408 to node 411 and isolating node 401 which allows inverters 406 and 408 to latch the NOR output to the last state it was in prior to the sleep mode. The OR output will likewise retain its state prior to the sleep mode.

Because all of the sense amplifier outputs SA1–SAn will go low during sleep mode to conserve power in the sense amplifier, transistors $402_1$–$402_n$ will all turn off allowing transistor 404 to pull node 401 high. Node 401 will, therefore, always be high in the sleep mode regardless of its state during the prior wake mode. Because of a time delay required for the sense amplifier which is in a high state prior to the sleep mode to power up and return from a low state to the high state during the next wake mode, wide OR gate 400 might produce an erroneous output for a short period. To prevent OR gate 400 from producing an erroneous output, circuitry (not shown) is provided to delay PHI and PHIB to the NOR gate until after the sense amplifiers have recovered from sleep mode.

As discussed above, to be compatible with a sense amplifier of the AmPALCE22V10Z-25 which does not latch its previous state, the wide OR gate 400 latches its output during sleep mode and includes circuitry (not shown) to delay power up until the sense amplifiers have had time to recover from sleep mode. Additionally, since the wide OR gate 400 latches a portion of its data path, additional time delay is provided to enable the OR gate 400 to recover from a sleep mode. Coincidentally, however, the design of the wide OR gate 400 typically offers a speed advantage and requires less space on a silicon chip than both OR gates of FIGS. 2A and 3A since only one additional transistor is required for each additional sense amplifier input.

Unlike sense amplifiers utilized on the AmPALCE22V10Z-25, however, more recent sense amplifiers are designed to latch their previous state in sleep mode while still consuming negligible power. Such a zero-power sense amplifier is disclosed in the copending U.S. application Ser. No. 08/118,432 entitled "Latching Zero-Power Sense Amplifier With Cascode", incorporated herein previously.

SUMMARY OF THE INVENTION

The present invention provides a wide OR gate designed for use in conjunction with more recent sense amplifiers which latch their previous state.

The present invention further provides a wide OR gate with circuitry to provide a faster operational speed than prior art wide OR gates shown in FIGS. 2A, 3A and 4.

The present invention further provides a wide OR gate which requires less space on the silicon chip for each added sense amplifier input in comparison to the OR gates in FIGS. 2A and 3A.

The present invention further provides an OR gate which, although not utilizing CMOS logic as in FIGS. 2A and 3A, consumes zero power during a sleep mode.

The wide OR gate of the present invention comprises: a plurality of input transistors, each input transistor having a gate connected for receiving a sense amplifier input from a plurality of sense amplifier inputs, the plurality of input transistors each having a source and drain coupled between a current supply node and $V_{SS}$, the current supply node being coupled to the logic gate output; and a current source coupling means for coupling a current source to the current supply node when the sleep mode signal is inactive and for decoupling the current source from the current supply node when the sleep mode signal is active.

Thus, with a single input transistor added for each sense amplifier input connection similar to the wide OR gate of FIG. 4, the present invention does not require the amount of silicon space as would the wide OR gates of FIGS. 2A and 3A. Further, the present invention operates faster than the circuitry of FIGS. 2A and 3A.

With the current source coupling means which decouples current during sleep mode, limited power is burned in sleep mode should a sense amplifier be on unlike the configuration of FIG. 4 which if connected to a sense amplifier which latched its previous state would burn power in sleep mode if a sense amplifier were on.

The current source of the wide OR gate of the present invention further comprises: a weak current source; and a strong current source, wherein the current source coupling means further (a) couples the weak current source to the current supply node and decouples the strong current source from the current supply node when the current supply node has a high value, and (b) couples the strong current source to the current supply node and decouples the weak current source from the current supply node when the current supply node has a low value.

By applying a weak current source during high to low transitions of the current supply node, the sense amplifier which turns on will transition the current supply node much faster than if the sense amplifier had to overcome current from the strong current source, thus increasing the overall speed of the wide OR gate of the present invention above the circuitry of FIG. 4. Similarly, by applying the strong current source during a low to high transition of the current supply node, current is available to more rapidly transition further increasing overall speed of the present invention.

The present invention further includes: an inverter having an inverter input coupled to the current supply node and an inverter output coupled to the logic gate output node; and a threshold shifting transistor for coupling the inverter output to $V_{SS}$ for a short time during a low to high transition of the current supply node.

Because the inverter has a large pull up transistor and a small pull down transistor, during low to high transitions, the large pull up transistor can be more easily overcome with the small pull down transistor of the inverter in combination with the threshold shifting transistor. By utilizing such a threshold shifting transistor, overall speed of the present invention is further increased.

BRIEF DESCRIPTION OF THE DRAWINGS

Further details of the present invention are explained with the help of the attached drawings in which:

FIG. 2A shows circuitry for a prior art CMOS wide OR gate;

FIG. 2B shows circuitry for the NOR gates utilized in the circuitry of FIG. 2A;

FIG. 2C shows circuitry for the NAND gates utilized in the circuitry of FIG. 2A;

DETAILED DESCRIPTION

Figure 4:
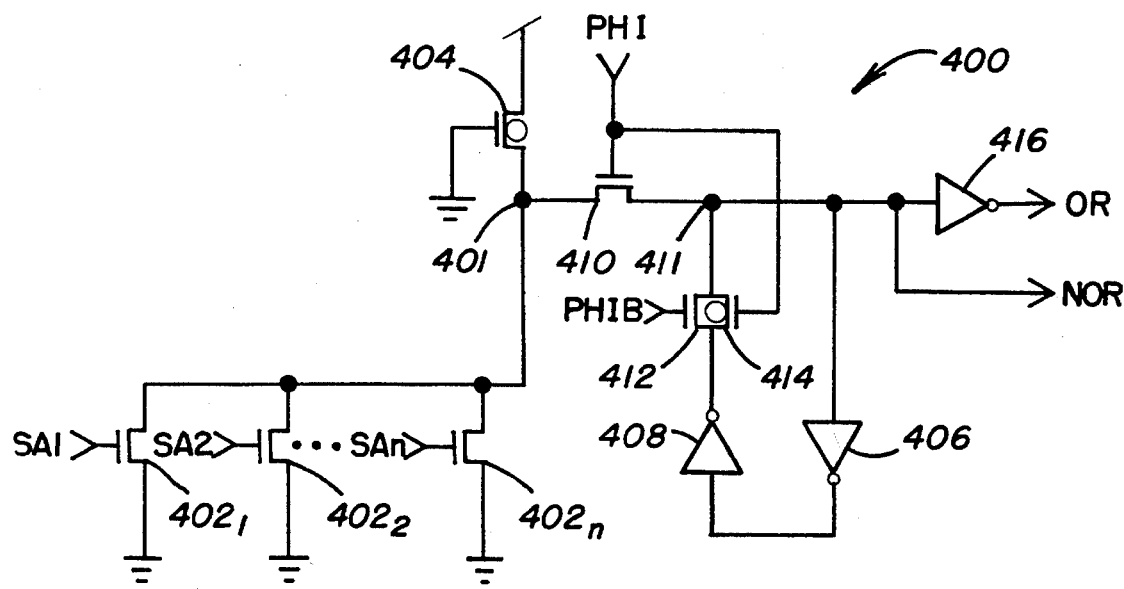
FIG. 4 shows a zero-power wide OR gate utilized in conjunction with sense amplifiers with outputs going to a low state during sleep mode.
Figure 5:
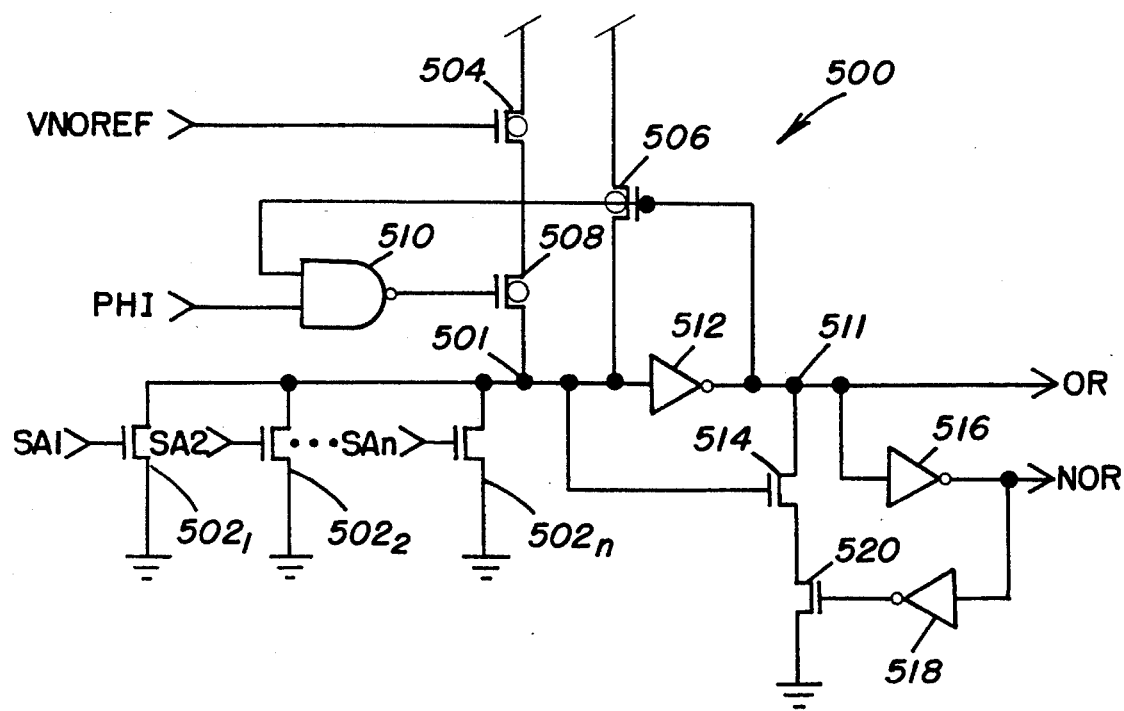
FIG. 5 shows the zero-power wide OR gate of the present invention.

FIG. 5 shows the zero-power wide OR gate 500 of the present invention. To receive the sense amplifier inputs, similar to the wide OR gate of FIG. 4, wide OR gate 500 includes n-channel transistors $502_1$–$502_n$ which receive input signals SA1–SAn from sense amplifiers at their gates. The sources of transistors $502_1$–$502_n$ are coupled to $V_{SS}$, while the drains are coupled to a current supply node 501.

To provide current to current supply node 501, wide OR gate 500 includes a strong current source p-channel transistor 504 and a weak current source p-channel transistor 506. The strong current source transistor 504 has a source connected to $V_{DD}$ and a gate connected to a voltage reference VNOREF. Weak current source transistor 506 has a source connected to $V_{DD}$ and a drain connected to the current supply node 501. A current coupling p-channel transistor 508 couples the strong current source transistor 504 to current supply node 501 by having a source connected to the drain of strong current source transistor 504 and a drain connected to the current supply node 501.

To control coupling of the strong and weak current source transistors 504 and 506 to the current supply node 501, a feedback is provided from an output node 511 of the wide OR gate 500. An inverter 512 couples the current supply node 501 to the wide OR gate output node 511. The feedback couples the wide OR gate output node 511 to the gate of weak current source transistor 506 and to a first input of a two input NAND gate 510. The second input of NAND gate 510 is connected to a line PHI. The line PHI carries a sleep mode signal indicating a sleep mode in a low state. The output of NAND gate 510 is connected to the gate of current coupling transistor 508.

Additional circuitry is provided in wide OR gate 500 to more easily overcome the input threshold of inverter 512 during a low to high transition of current supply node 501. Inverter 512 includes CMOS logic having a large pull up p-channel transistor and a small pull down n-channel transistor. To lower the threshold of inverter 512 during a low to high transition of current supply node 501, a threshold shifting n-channel transistor 514 is provided with a gate connected to current supply node 501 and a drain connected to the wide OR gate output node 511. A threshold coupling n-channel transistor 520 has a drain connected to the source of transistor 514 and a source connected to $V_{SS}$. Two series inverters 516 and 518 have an input connected to wide OR gate output node 511 and an output connected to the gate of transistor 520 to provide a time delay to rapidly pull down node 511 only during a low to high transition of the current supply node 501.

The OR output of wide OR gate 500 is supplied directly from wide OR gate output node 511. A NOR output of the wide OR gate 500 is supplied by a connection between series invertors 516 and 518.

Because wide OR gate 500 does not latch its previous state during a sleep mode, wide OR gate 500 is intended to be used in conjunction with a sense amplifiers which latch their previous state.

Operation of wide OR gate 500 is described as follows:

1. Wake State, One Sense Amplifiers High

In operation, we begin by assuming a first state where the sleep mode signal indicates an awake state with PHI being high, and one sense amplifier is on making its respective output SA1–SAn high.

With a sense amplifier output SA1–SAn being high, the associated input transistor $502_1$–$502_n$ will conduct pulling node 501 low. Inverter 512 will then pull node 511 high and hence the OR output of the wide OR gate 500 high. Because node 511 is high, the weak current source transistor 506 will be off and by the action of inverter 516, the NOR output of the wide OR gate 500 will be low. Since the NOR output is low, the action of inverter 518 turns on threshold coupling transistor 520 which enables threshold shifting transistor 514. The threshold shifting transistor 514 now acts in conjunction with inverter 512 to lower the effective input transition threshold of inverter 512 relative to node 501 for a future low to high transition of node 501. Because PHI and node 511 are both high, the output of NAND gate 510 goes low which turns on current coupling transistor 508. VNOREF is set such that the current sourced by strong current source transistor 504 cannot overcome the input transistor of transistors $502_1$–$502_n$ which is on so the current supply node 501 remains low. Current is supplied by strong current source transistor 504 in order to speed up a future low to high transition of node 501 when all sense amplifiers turn off.

2. Transition To Sleep Mode, One Sense Amplifier High

We next assume a second state is entered in which transition is made to a sleep mode with PHI switching to low, and that one or more sense amplifiers remain on.

When PHI goes low, the output of NAND gate 510 goes high turning current coupling transistor 508 off. With the weak current coupling transistor 506 remaining off, node 501 will remain low, and all current flow stops. With node 501 remaining low, the OR and NOR outputs of wide OR gate 500 retain their previous state.

3. Transition To Wake Mode, One Sense Amplifier High

We next assume that a transition is made back to the first awake state with PHI switching back to high and one or more sense amplifiers remaining on.

With one or more sense amplifiers remaining high and PHI returning to high, NAND gate 510 goes low turning current coupling transistor 508 back on to supply current to current supply node 501. With a sense amplifier on, its corresponding transistor $502_1$–$502_n$ will overcome strong current source 504 and node 501 will remain low. With node 501 remaining low, the OR and NOR outputs of wide OR gate 500 retain their previous state and conditions will remain as described above in the first state.

4. Wake Mode, Transition To No Sense Amplifiers High

We next assume a third state is entered in which the wake mode is still maintained with PHI remaining high, while all sense amplifiers now turn off making all outputs SA1–SAn low and turning all transistors $502_1$–$502_n$ off.

Because the output of NAND gate 510 is low, with all transistors $502_1$–$502_n$ turning off, current coupling transistor 508 conducts so that strong current source transistor 504 can pull current supply node 501 high. Threshold shifting transistor 514 speeds the action of inverter 512 to pull the OR output low. When the OR output goes low, inverter 516 pulls the NOR output high, which in turn causes the output of inverter 518 to go low turning threshold coupling transistor 520 off thereby disabling threshold shifting transistor 514. Threshold shifting transistor 514 now no longer acts in conjunction with inverter 512, thus creating a higher input transition threshold which is desired for later rapid high to low transitions of current supply node 501. With the OR output being low, weak current supply transistor 506 turns on. Regardless of whether PHI is high or low, because the OR output is low, the output of NAND gate 510 will be high which turns off current coupling transistor 508 isolating the current supply node 501 from the strong current source transistor 504. The current supply node 501 continues to be held high by weak current source transistor 506. Current is supplied by weak current source transistor 506 in order to speed up a future high to low transition of current supply node 501 when one of the sense amplifiers turns on.

5. Transition To Sleep Mode, No Sense Amplifiers High

We next assume a fourth state is entered in which transition is made to a sleep mode with PHI switching to low, and all sense amplifiers remaining off.

When PHI goes low, no change occurs. Because node 501 is high, the output of NAND gate 510 remains high keeping current coupling transistor 508 off. The weak current source transistor 506 continues to hold the current supply node 501 high.

6. Transition To Wake Mode, No Sense Amplifiers High

We next assume that a transition is made back to the third awake state with PHI switching back to high and all sense amplifiers remaining off.

When PHI goes high, because node 501 remains high the output of NAND gate 510 remains high and no other change occurs.

7. Wake Mode, Transition To One Sense Amplifier High

We next assume that a transition is made back to the first state with PHI remaining high in an awake mode, and one or more sense amplifiers transitioning to on.

A sense amplifier turning on will turn an associated input SA1–SAn high turning on its associated input transistor $502_1$–$502_n$. The associated input transistor $502_1$–$502_n$ will overcome the weak current source transistor 506 to pull the current supply node 501 low. The relatively high input transition threshold of inverter 512 will rapidly pull the OR output high. Conditions now return to conditions of the first state described previously.

Conclusion

Figure 1:
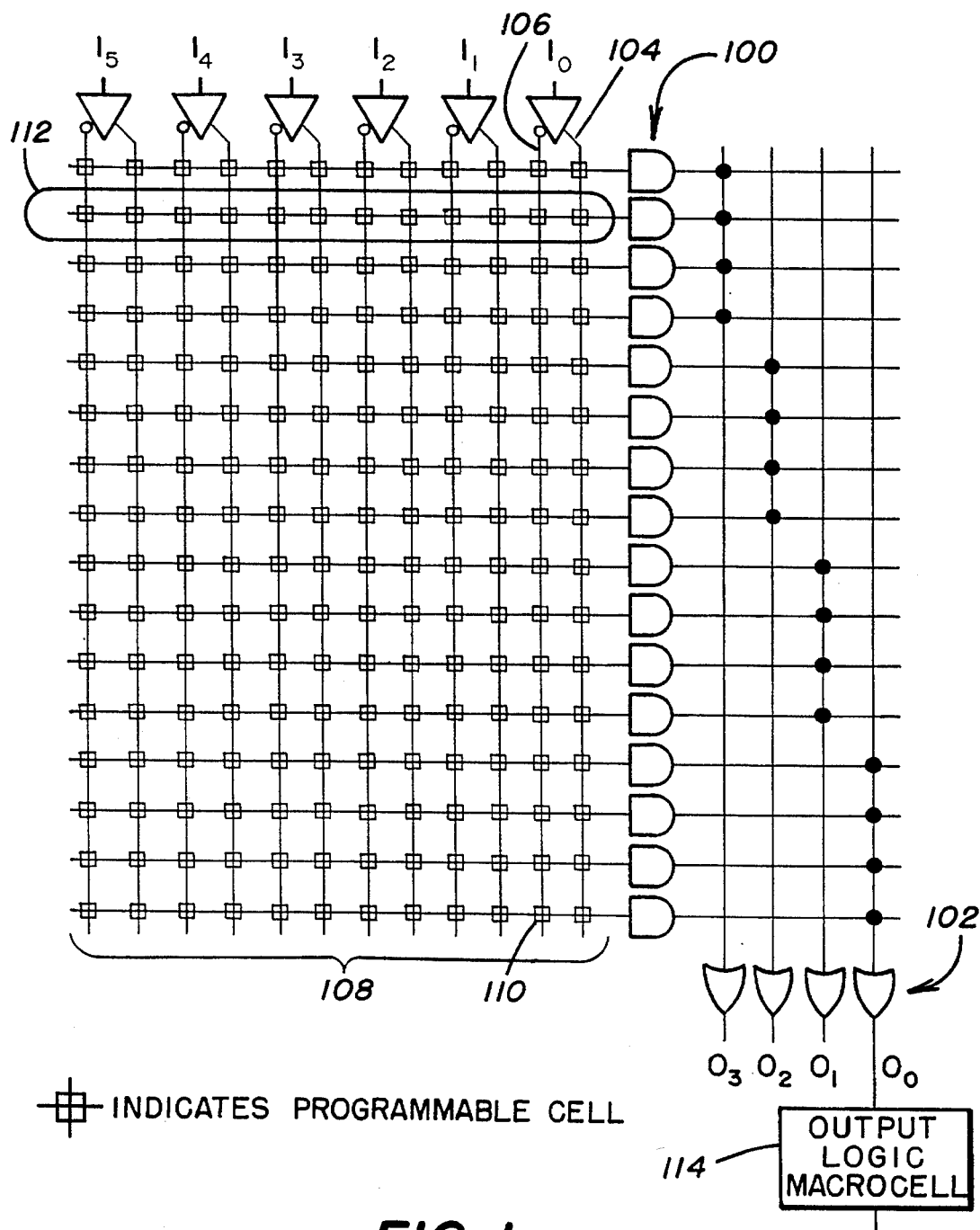
FIG. 1 shows an array structure for a typical prior art PAL device utilizing a wide OR gate to implement the "sum" to produce a "sum of product terms" output.
Figure 3A:
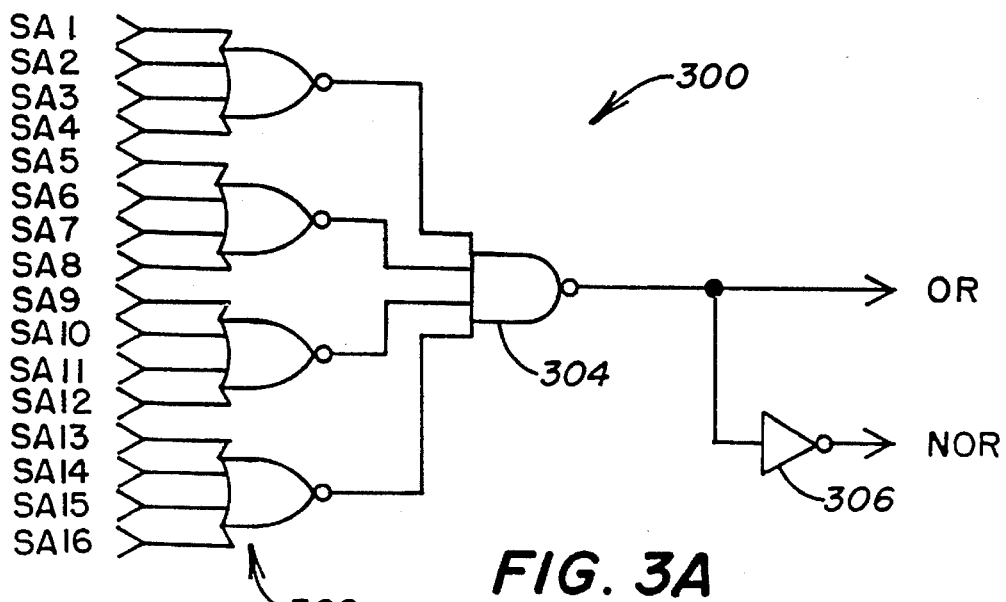
FIG. 3A shows circuitry for a prior art CMOS wide OR gate 300 having a lower transistor count than the wide OR gate of FIG. 2A.
Figure 3B:
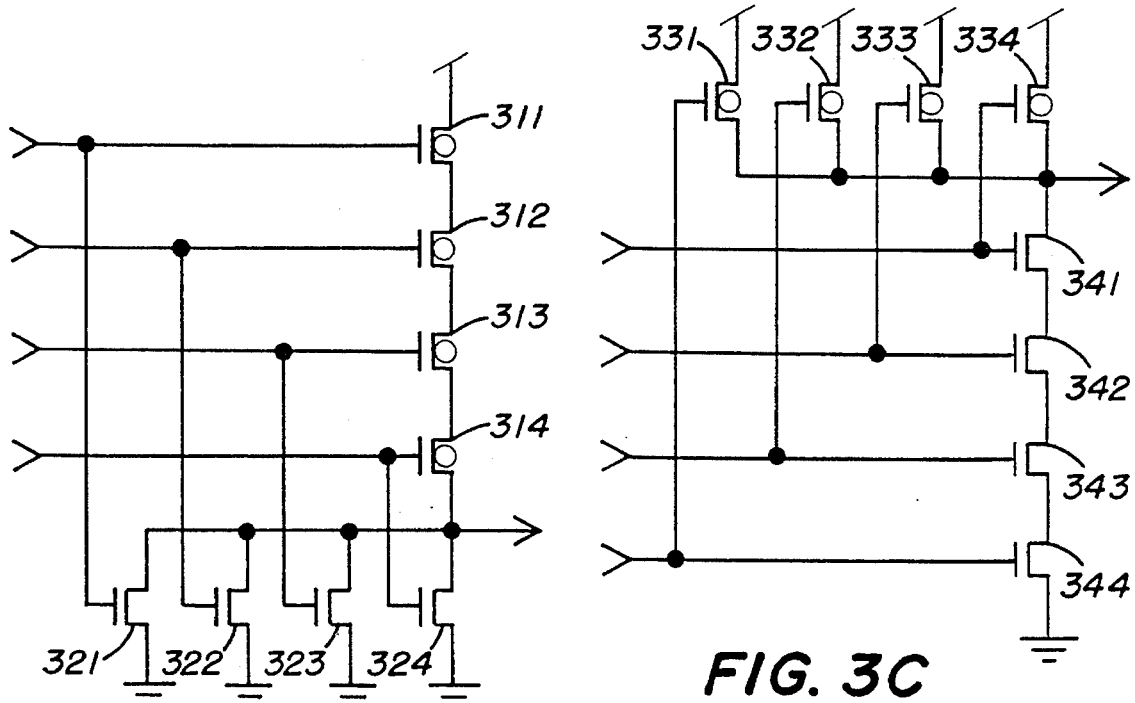
FIG. 3B shows circuitry for the NOR gates utilized in the circuitry of FIG. 3A.
Figure 3B:
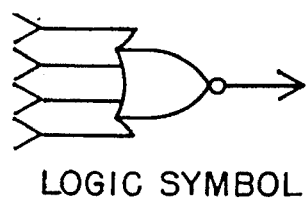
Figure 3C:
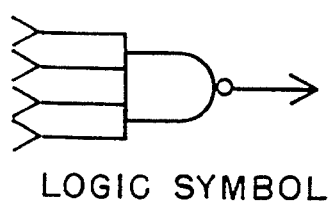
FIG. 3C shows circuitry for the NAND gates utilized in the circuitry of FIG. 3A.

The present invention of a wide OR gate 500 offers several advantages over prior art wide OR gates. First, with a single input transistor of transistors $502_1$–$502_n$ added for each sense amplifier input connection similar to the wide OR gate of FIG. 4, the present invention does not require the amount of silicon space as would the wide OR gates of FIGS. 2A and 3A. Further, having circuitry similar to FIG. 4, the present invention similarly operates faster than the circuitry of FIGS. 2A and 3A.

With NAND gate 510 configured to decouple current during sleep mode, limited power is burned in sleep mode should a sense amplifier be on unlike the configuration of FIG. 4 which if connected to a sense amplifier which latched its previous state would burn power in sleep mode if a sense amplifier were on.

By applying a weak current source 506 during high to low transitions of the current supply node 501, the sense amplifier which turns on will transition much faster than if the sense amplifier had to overcome current from the strong current source, thus increasing the overall speed of the wide OR gate of the present invention above the circuitry of FIG. 4. Similarly, by applying the strong current source 506 during a low to high transition of the current supply node 501, current is available to more rapidly transition further increasing overall speed of the present invention.

Because inverter 512 has a large pull up transistor and a small pull down transistor, during low to high transitions, the large pull up transistor can be more easily overcome with the small pull down transistor of the inverter in combination with the threshold shifting transistor 514. By utilizing threshold shifting transistor 514, overall speed of the present invention is further increased.

Although the invention has been described above with particularity, this was merely to teach one of ordinary skill in the art how to make and use the invention. Many modifications will fall within the scope of the invention, as that scope is defined by the following claims.

What is claimed is:

1. A logic gate for implementing a "sum" of a "sum of product terms" output of a programmable logic device, the logic gate receiving a plurality of sense amplifier inputs and a sleep mode signal which when active indicates low power is to be utilized, the logic gate providing an output signal at a logic gate output node, the logic gate comprising:

a plurality of input transistors, each input transistor having a gate connected for receiving a sense amplifier input from the plurality of sense amplifier inputs, the plurality of input transistors each having a source and drain coupled between a current supply node and a first potential, the current supply node being coupled to the logic gate output node;

a current source;

a current coupling transistor having a source to drain path coupling the current source to the current supply node, and having a gate; and a control gate having a first input connected to receive the sleep mode signal, a second input coupled to the current supply node, and an output coupled to the current coupling transistor gate, the control gate for coupling the current source to the current supply node when the sleep mode signal is inactive and the current supply node is in a low State and for decoupling the current source from the current supply node when the sleep mode signal is active Or when the current supply node is in a high state, 2. The logic gate of claim 1 further comprising:

a weak current source transistor having a gate coupled to the logic gate output node so that the weak current source is coupled to the current supply node when the current supply node has a high value, and decoupled from the current supply node when the current supply node has a low value.

3. The logic gate of claim 1 further comprising:

an inverter having an inverter input coupled to the current supply node and an inverter output coupled to the logic gate output node; and an inverter threshold shifting means for coupling the inverter output to the first potential for a predetermined time during a low to high transition of the current supply node.

4. A logic gate for implementing a "sum" of a "sum of product terms" output of a programmable logic device, the logic gate receiving a plurality of sense amplifier inputs and providing an output signal at a logic gate output node, the logic gate comprising:

a plurality of input transistors, each input transistor having a gate connected for receiving a sense amplifier input from the plurality of sense amplifier inputs, the plurality of input transistors each having a source and drain coupled between a current supply node and a first potential, the current supply node being coupled to the logic gate output node;

a weak current source;

a strong current source; and a current source coupling means for (a) coupling the weak current source to the current supply node and decoupling the strong current source from the current supply node when the current supply node has a high value, and (b) coupling the strong current source to the current supply node and decoupling the weak current source from the current supply node when the current supply node has a low value.

5. The logic gate of claim 4 further comprising:

an inverter having an inverter input coupled to the current supply node and an inverter output coupled to the logic gate output node; and an inverter threshold shifting means for coupling the inverter output to the first potential for a predetermined time during a low to high transition of the current supply node.

6. The logic gate of claim 5 wherein the current source coupling means comprises:

a current coupling transistor having a source and drain coupled between the strong current source and the current supply node;

a NAND gate having a first input coupled to receive the sleep mode signal and an output coupled to a gate of the current coupling transistor; and a feedback line coupled to the current supply node, a control gate of the weak current source and to a second input of the NAND gate.

7. A logic gate for implementing a "sum" of a "sum of product terms" output of a programmable logic device, the logic gate receiving a plurality of sense amplifier inputs and providing an output signal at a logic gate output node, the logic gate comprising:

a plurality of input transistors, each input transistor having a gate connected for receiving a sense amplifier input from the plurality of sense amplifier inputs, the plurality of input transistors each having a source and drain coupled between a current supply node and a first potential, the current supply node being coupled to the logic gate output node;

a current source coupled to the current supply node;

an inverter having an inverter input coupled to the current supply node and an inverter output coupled to the logic gate output node; and an inverter threshold shifting means for coupling the inverter output to the first potential for a predetermined time during a low to high transition of the current supply node.

8. The logic gate of claim 7 wherein the inverter threshold shifting means comprises:

a threshold shifting transistor having a gate coupled to the current supply node, a drain coupled to the logic gate output node and a source;

two series inverters having an input coupled to the logic gate output node and an output; and a threshold coupling transistor having a drain coupled to the source of the threshold shifting transistor, a gate coupled to the output of the two series inverters, and a source coupled to the first potential.

9. A logic gate for implementing a "sum" of a "sum of product terms" output of a programmable logic device, the logic gate receiving a plurality of sense amplifier inputs and a sleep mode signal which when active indicates low power is to be utilized, the logic gate providing an output signal at a logic gate output node, the logic gate comprising:

a plurality of n-channel input transistors, each input transistor having a gate connected for receiving a sense amplifier input from the plurality of sense amplifier inputs, the plurality of input transistors each having a drain coupled to a current supply node and a source coupled to a first potential;

a strong current source p-channel transistor having a gate coupled to a voltage reference, a source coupled to a second potential and a drain;

a weak current source p-channel transistor having a source coupled to the second potential, a drain coupled to the current supply node and a gate;

a current coupling p-channel transistor having a source coupled to the drain of the strong current source p-channel transistor and a drain coupled to the current supply node;

a NAND gate having a first input coupled to receive the sleep mode signal and an output coupled to a gate of the current coupling transistor;

an inverter having an inverter input coupled to the current supply node and an inverter output coupled to the logic gate output node;

a feedback line coupled to the current supply node, the gate of the weak current source p-channel transistor and to a second input of the NAND gate;

a threshold shifting n-channel transistor having a gate coupled to the current supply node, a drain coupled to the logic gate output node and a source;

two series inverters having an input coupled to the logic gate output node and an output; and a threshold coupling n-channel transistor having a drain coupled to the source of the threshold shifting transistor, a gate coupled to the output of the two series inverters, and a source coupled to the first potential.

10. A programmable array logic device receiving a sleep mode signal which when active indicates low power is to be utilized, the programmable array logic device comprising:

a plurality of programmable array cells comprising subpluralities of programmable array cells, each said subplurality comprising array cells with outputs coupled to a product term line;

a plurality of sense amplifiers, each said sense amplifier in the plurality of sense amplifiers coupled to a given product term line of one of the subpluralities of programmable array cells;

a plurality of OR gates coupled to receive an output from at least one said sense amplifier, each said OR gate comprising:

a plurality of n-channel input transistors, each input transistor having a gate connected for receiving a sense amplifier output from a sense amplifier in the plurality of sense amplifiers, the plurality of input transistors each having a drain coupled to a current supply node and a source coupled to a first potential;

a strong current source p-channel transistor having a gate coupled to a voltage reference, a source coupled to a second potential and a drain;

a weak current source p-channel transistor having a source coupled to the second potential, a drain coupled to the current supply node and a gate;

a coupling transistor having a source coupled to the drain of the strong current source p-channel transistor and a drain coupled to the current supply node;

a NAND gate having a first input coupled to receive the sleep mode signal and an output coupled to a gate of the current coupling transistor;

an inverter having an inverter input coupled to the current supply node and an inverter output coupled to the logic gate output node;

a current coupling feedback coupled to the gate of the weak current source p-channel transistor and to a second input of the NAND gate;

a first threshold shifting n-channel transistor having a gate coupled to the current supply node, a drain coupled to the logic gate output node and a source;

two series inverters having an input coupled to the logic gate output node and an output; and a second threshold shifting n-channel transistor having a drain coupled to the source of the first threshold shifting transistor, a gate coupled to the output of the two series inverters, and a source coupled to the first potential; and a plurality of output logic macrocells, each of the output logic macrocells coupled to the logic gate output node of an OR gate in the plurality of OR gates, each of the output logic macrocells being programmable to select whether its output will be registered or combinatorial.

11. A logic gate for implementing a "sum" of a "sum of product terms" output of a programmable logic device, the logic gate receiving a plurality of sense amplifier inputs and a sleep mode signal which when active indicates low power is to be utilized, the logic gate providing an output signal at a logic gate output node, the logic gate comprising:

a plurality of input transistors, each input transistor having a gate connected for receiving a sense amplifier input from the plurality of sense amplifier inputs and a source to drain path connecting a current supply node to a first potential;

a strong current source transistor having a gate coupled to a voltage reference, and a source to drain path having a first end coupled to a second potential and a second end;

a current coupling p-channel transistor having a source coupled to the second end of the source to drain path of the strong current source transistor and a drain connected to the current supply node;

a NAND gate having a first input coupled to receive the sleep mode signal, a second input, and an output connected to a gate of the current coupling transistor; and an inverter having an input connected to the current supply node and an output connected to the logic gate output node and to the second input of the NAND gate.

12. The logic gate of claim 11 further comprising:

a weak current source p-channel transistor having a source connected to the second potential, a drain connected to the current supply node and a gate connected to the output of the inverter.

13. The logic gate of claim 12 further comprising:

a threshold shifting n-channel transistor having a gate connected to the current supply node, a drain coupled to the logic gate output node and a source;

two series inverters having an input coupled to the logic gate output node and an output; and a threshold coupling n-channel transistor having a drain connected to the source of the threshold shifting transistor, a gate connected to the output of the two series inverters, and a source connected to the first potential.

* * * * *